United States Patent
Chin et al.

(10) Patent No.: US 9,853,136 B2
(45) Date of Patent: Dec. 26, 2017

(54) DIRECTED EPITAXIAL HETEROJUNCTION BIPOLAR TRANSISTOR

(71) Applicant: VISUAL PHOTONICS EPITAXY CO., LTD., Taoyuan (TW)

(72) Inventors: Yu-Chung Chin, New Taipei (TW); Chao-Hsing Huang, Taipei (TW); Min-Nan Tseng, New Taipei (TW)

(73) Assignee: VISUAL PHOTONICS EPITAXY CO., LTD., Taoyuan (TW)

(*) Notice: Subject to any disclaimer, the term of this patent is extended or adjusted under 35 U.S.C. 154(b) by 1 day.

(21) Appl. No.: 14/535,431

(22) Filed: Nov. 7, 2014

(65) Prior Publication Data

US 2015/0255585 A1 Sep. 10, 2015

(30) Foreign Application Priority Data

Mar. 7, 2014 (TW) .............................. 103107966 A

(51) Int. Cl.
| | |
|---|---|
| *H01L 21/8252* | (2006.01) |
| *H01L 29/737* | (2006.01) |
| *H01L 27/07* | (2006.01) |
| *H01L 29/205* | (2006.01) |
| *H01L 29/08* | (2006.01) |
| *H01L 29/201* | (2006.01) |
| *H01L 27/06* | (2006.01) |

(52) U.S. Cl.
CPC ...... *H01L 29/7378* (2013.01); *H01L 21/8252* (2013.01); *H01L 27/0705* (2013.01); *H01L 27/0716* (2013.01); *H01L 29/0821* (2013.01); *H01L 29/201* (2013.01); *H01L 29/205* (2013.01); *H01L 27/0623* (2013.01)

(58) Field of Classification Search
CPC .................................................. H01L 21/8252
See application file for complete search history.

(56) References Cited

U.S. PATENT DOCUMENTS

| | | | |
|---|---|---|---|
| 5,647,917 A * | 7/1997 | Oida ....................... | C30B 23/02 117/101 |
| 7,656,002 B1 * | 2/2010 | Barratt ................ | H01L 21/8252 257/197 |
| 2005/0145857 A1 * | 7/2005 | Maruyama ............. | B82Y 20/00 257/79 |

(Continued)

*Primary Examiner* — Thao X Le
*Assistant Examiner* — Geoffrey Ida
(74) *Attorney, Agent, or Firm* — Lin & Associates Intellectual Property, Inc.

(57) ABSTRACT

A directed epitaxial heterojunction bipolar transistor (HBT) structure is directly or indirectly formed on a GaAs substrate that is formed by a (100) face towards a (111)B face with an angle of inclination between 0.6° and 25°, and includes a sub-collector layer, a collector, a base layer, an emitter layer, an emitter cap layer and an ohmic contact layer, which are sequentially formed on the substrate. A tunnel collector layer formed by InGaP or InGaAsP is provided between the collector layer and the base layer. Since an epitaxial process is performed on the substrate from a (100) face towards a (111)B face with an angle of inclination between 0.6° and 25°, indium and gallium contained in InGaP or InGaAsP are affected by the ordering effect such that InGaP or InGaAsP used in the emitter layer and/or the tunnel collector layer has a higher electron affinity or a smaller bandgap.

22 Claims, 8 Drawing Sheets

(56) References Cited

U.S. PATENT DOCUMENTS

| | | | |
|---|---|---|---|
| 2006/0113566 A1* | 6/2006 | Krutko | H01L 27/0623 257/197 |
| 2007/0090399 A1* | 4/2007 | Chin | H01L 27/0605 257/197 |
| 2008/0212636 A1* | 9/2008 | Sato | H01S 5/18311 372/50.11 |

* cited by examiner

DIRECTED EPITAXIAL HETEROJUNCTION BIPOLAR TRANSISTOR

CROSS-REFERENCES TO RELATED APPLICATIONS

This application claims the priority of Taiwanese patent application No. 103107966, filed on Mar. 7, 2014, which is incorporated herewith by reference.

BACKGROUND OF THE INVENTION

1. Field of the Invention

The present invention generally relates to a heterojunction bipolar transistor (HBT) structure, and more specifically to a directed epitaxial HBT structure having an InGaP tunnel collector layer and/or emitter layer formed on a Gallium Arsenide (GaAs) substrate in a specific direction.

2. The Prior Arts

Generally, a heterojunction bipolar transistor (HBT) is a specific transistor having an emitter and a base formed by different semiconductor materials. Accordingly, a heterojunction is formed between the emitter and the base. One advantage of a HBT (such as an NPN HBT) is that the emitter injection efficiency is greatly increased because it is difficult for the hole current to flow through the valence band barrier ($\Delta E_v$) between the base and the emitter. The current gain is thus further enhanced under the higher base dopant concentration. The efficiency of power amplifiers is an important factor when HBTs are used in power amplifiers of hand-held devices. It should be noted that the key factors of a HBT are the knee voltage and the turn-on voltage. Therefore, one of the important issues is how to effectively decrease the knee voltage and the turn-on voltage of a HBT.

In the prior arts, a HBT is formed on the GaAs substrate that is formed by a (100) face or a (100) face towards (110) face with an angle of inclination of about 2°. Preferably, the HBT base layer is formed by a GaAs semiconductor material, and the emitter and the tunnel collector are formed by InGaP. Since InGaP is formed on the GaAs substrate by a (100) face towards a (110) face at an angle of inclination of about 2°, it is difficult for indium and gallium to be arranged in a <111> direction in the high degree of order, thereby resulting in the electron affinity of InGaP to be smaller or far smaller than that of GaAs. Thus, the discontinuity exists between the conduction bands of the base-emitter junction and the base-tunnel collector junction. As such, the HBT has a high turn-on voltage. Moreover, the collector current blocking effect is created, and the knee voltage is increased such that the power added efficiency (PAE) of the HBT is decreased.

Therefore, it is necessary for a HBT structure grown on a different inclination face to have the emitter layer and/or the tunnel collector layer, generally formed by InGaP or InGaAsP, a higher electron affinity or a smaller bandgap. The discontinuity between the conduction bands of the base-emitter and base-tunnel collector junctions is then decreased so as to lower the turn-on voltage and the offset voltage of the HBT, thereby improving the collector current blocking effect, decreasing the knee voltage, greatly increasing the PAE of the HBT power amplifier and enhancing the overall electrical performance.

SUMMARY OF THE INVENTION

The primary objective of the present invention is to provide a directed epitaxial heterojunction bipolar transistor (HBT) structure formed on a GaAs substrate that is formed by a (100) face towards a (111)B face (i.e., (1-11) or (11-1)). The directed epitaxial HBT of the present invention includes a sub-collector layer, a collector layer, a tunnel collector layer, a base layer, an emitter layer, an emitter cap layer and an ohmic contact layer, which are sequentially stacked on the GaAs substrate.

Specifically, the tunnel collector layer is formed by InGaP or InGaAsP, and the emitter layer is formed by N-type group III-V semiconductors having a bandgap larger than that of the base layer. Since an epitaxial process is performed on the substrate from a (100) face towards a (111)B face, indium and gallium contained in InGaP or InGaAsP are affected by the ordering effect such that InGaP or InGaAsP used in the emitter layer and/or the tunnel collector layer has a higher electron affinity or a smaller bandgap. Accordingly, the discontinuity between a base-emitter junction and/or a base-tunnel collector junction is decreased so as to lower the turn-on voltage and the offset voltage ($V_{OS}$) of the HBT, thereby improving the collector current blocking effect, decreasing the knee voltage ($V_{KNEE}$), greatly increasing the PAE for the HBT power amplifier (PA) and enhancing the overall electrical characteristics.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms, and the details of the preferred embodiments of the present invention will be described in the subsequent contents with reference to the accompanying drawings. The drawings (not to scale) show and depict only the preferred embodiments of the present invention, and will not be considered as limitations to the scope of the present invention. Modifications of the present invention should be considered within the spirit of the present invention.

Figure 1:
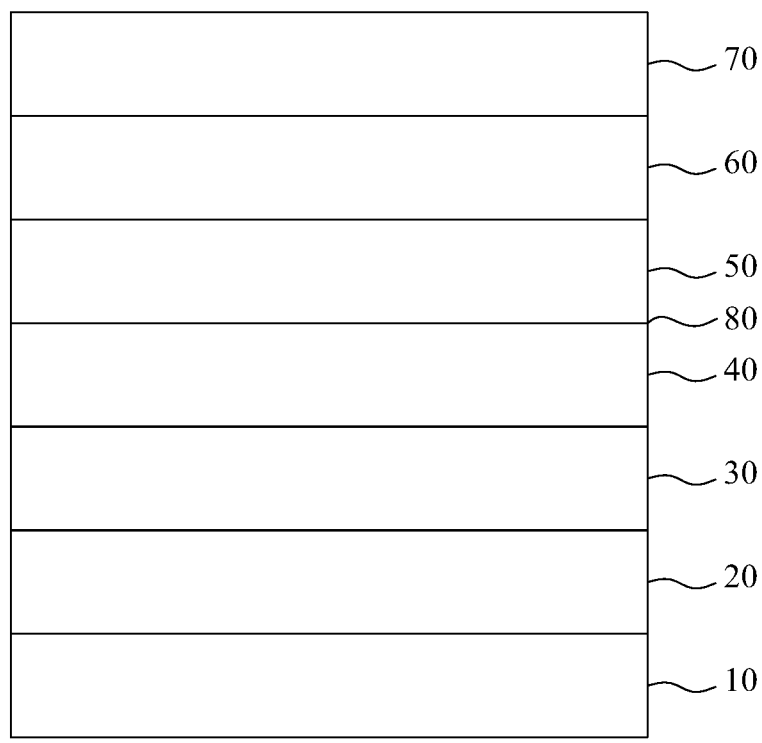
FIG. 1 is a sectional view showing a directed epitaxial heterojunction bipolar transistor (HBT) structure according to a first embodiment of the present invention.

FIG. 1 is a sectional view showing a directed epitaxial heterojunction bipolar transistor (HBT) structure according to a first embodiment of the present invention. As shown in FIG. 1, the directed epitaxial HBT of the present invention includes a sub-collector layer 20, a collector layer 30, a base layer 40, an emitter layer 50, an emitter cap layer 60 and an ohmic contact layer 70, which are sequentially stacked on the substrate 10. Specifically, the sub-collector layer 20 is formed by N-type group III-V semiconductors, and stacked on the substrate 10. The substrate 10 is preferably formed by GaAs that is formed by a (100) face towards a (111)B face with an angle of inclination between 0.6° and 25°. Moreover, the collector layer 30 is stacked on the sub-collector layer 20 and formed by N-type group III-V semiconductors. The base layer 40 is stacked on the collector layer 30 and formed by P-type group III-V semiconductors. The emitter layer 50 is stacked on the base layer 40 and is formed by N-type InGaP or InGaAsP. The emitter cap layer 60 is stacked on the emitter layer 50 and formed by N-type group III-V semiconductors. The ohmic contact layer 70 is stacked on the emitter cap layer 60 and formed by N-type group III-V semiconductors.

Moreover, the collector layer 30 can be formed by at least one of N-type GaAs, AlGaAs, InGaAs, InGaP and InGaAsP, the base layer 40 is formed by at least one of P-type GaAs, InGaAs, InGaAsN and GaAsSb. The emitter cap layer 60 may be formed by at least one of N-type GaAs, InGaP, InGaAsP and AlGaAs. The ohmic contact layer 70 can be formed by at least one of N-type GaAs and InGaAs.

Since the substrate 10 is formed by a (100) face towards a (111)B face, the lattice structure of the aforesaid epitaxial layer is improved so as to form a high degree of order, InGaP or InGaAsP decrease the conduction band and increase the valence band, thereby narrowing the bandgap.

In addition, at least one thin layer 80 formed by group III-V semiconductors is further provided between the emitter layer 50 and the base layer 40. Especially, a conduction band of the at least one thin layer is equivalent to and/or lower than a conduction band of the emitter layer 50, and the at least one thin layer has a total thickness between 1 Å and 1000 Å (1 Å=1×10$^{-10}$ m). Specifically, the at least one thin layer is formed by at least one of AlGaAs, InGaP, InGaAsP, GaAs, GaAsP, InGaAs, GaAsSb and InGaAsN.

Figure 2:
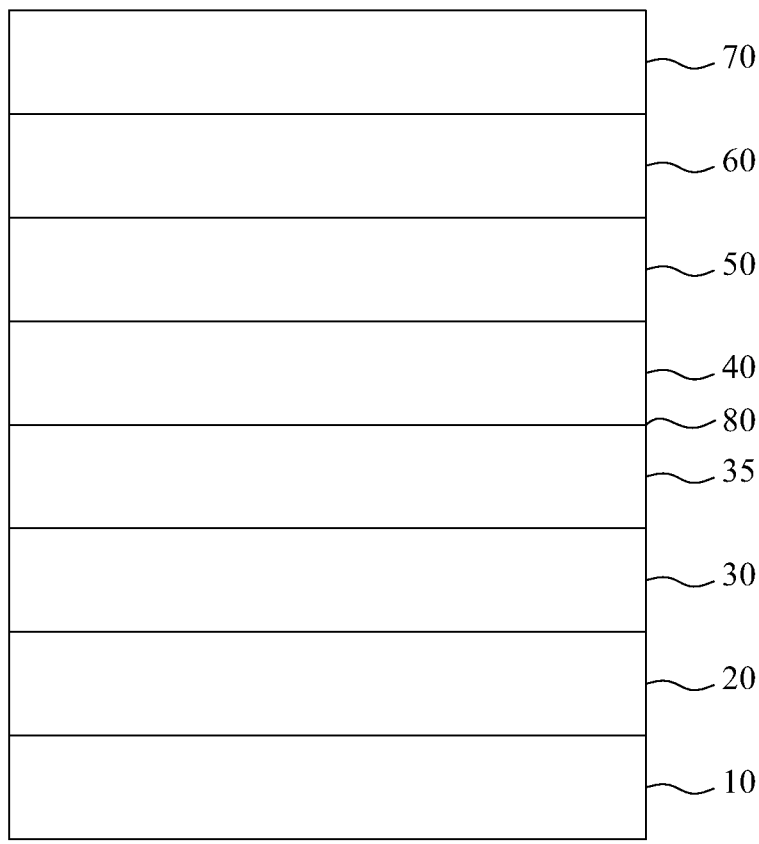
FIG. 2 is a sectional view showing the directed epitaxial HBT structure according to a second embodiment of the present invention.

FIG. 2 is a sectional view showing the directed epitaxial HBT structure according to a second embodiment of the present invention. The directed epitaxial HBT of the present invention includes a sub-collector layer 20, a collector layer 30, a tunnel collector layer 35, a base layer 40, an emitter layer 50, an emitter cap layer 60 and an ohmic contact layer 70, which are sequentially stacked on the substrate 10. Similarly, the sub-collector layer 20 is formed by N-type group III-V semiconductors, and is stacked on the substrate 10. The substrate 10 is formed by GaAs that is formed by a (100) face towards a (111)B face with an angle of inclination between 0.6° and 25°.

It should be noted that the second embodiment shown in FIG. 2 is similar to the first embodiment of FIG. 1, and the primary difference between the first embodiment and the second embodiment is that the second embodiment further includes the tunnel collector layer 35 formed by InGaP or InGaAsP and provided between the collector layer 30 and the base layer 40. Moreover, at least one thin layer 80 is further provided between the tunnel collector layer 35 and the base layer 40. The at least one thin layer is formed by group III-V semiconductors, and a conduction band of the at least one thin layer is equivalent to and/or lower than a conduction band of the tunnel collector layer 35. The thickness of the at least one thin layer ranges between 1 Å and 1000 Å. More specifically, the at least one thin layer is formed by at least one of AlGaAs, InGaP, InGaAsP, GaAs, GaAsP, InGaAs, GaAsSb and InGaAsN, Further, the emitter layer 50 stacked on the base layer 40 is formed by N-type group III-V semiconductors having a bandgap larger than that of the base layer 40. The other elements included in the second embodiment are the same as those of the first embodiment, and the detailed descriptions for those elements are not repeated hereinafter.

Figure 3:
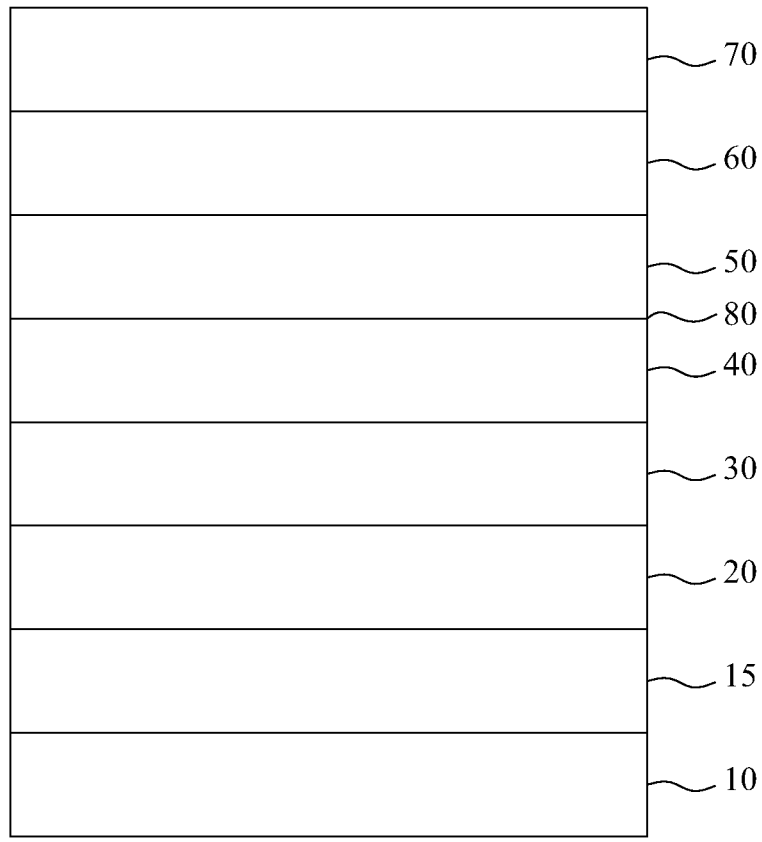
FIG. 3 is a sectional view showing the directed epitaxial HBT structure according to a third embodiment of the present invention.
Figure 3A:
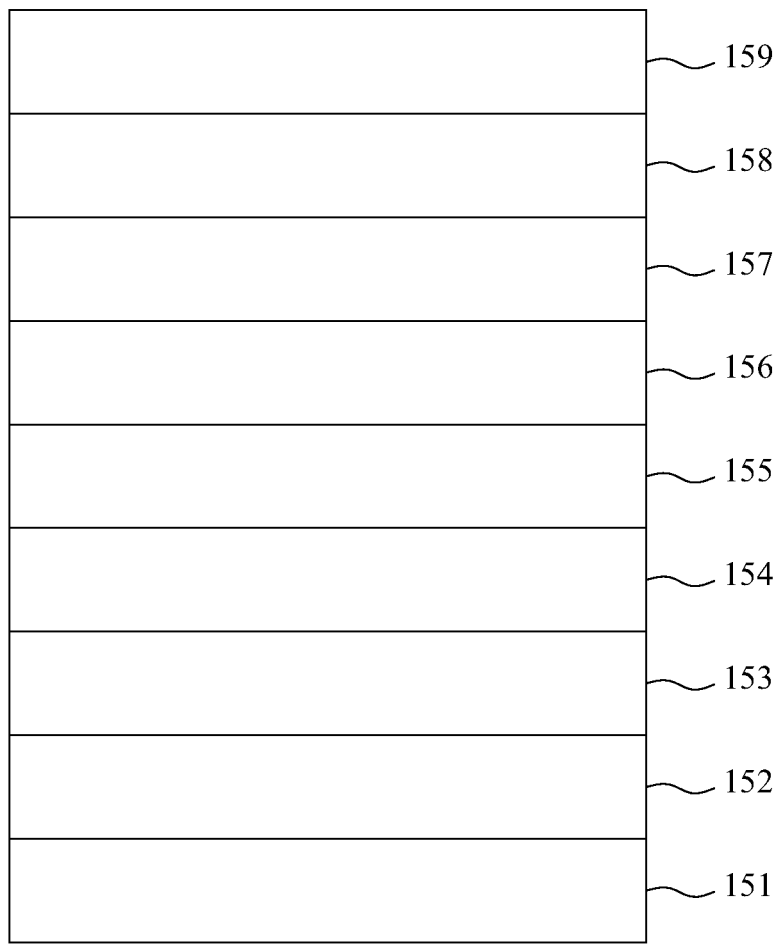
FIG. 3(a) is a sectional view showing that the intermediate composite layer 15 of the third embodiment may include a pseudomorphic high-electron-mobility transistor (pHEMT).

FIG. 3 is a sectional view showing the directed epitaxial HBT structure according to the third embodiment of the present invention. As shown in FIG. 3, the directed epitaxial HBT of the present invention includes an intermediate composite layer 15, a sub-collector layer 20, a collector layer 30, a base layer 40, an emitter layer 50, an emitter cap layer 60 and an ohmic contact layer 70, which are sequentially stacked on the substrate 10. The intermediate composite layer 15 is formed by semiconductor materials and is stacked on the substrate 10. Accordingly, the substrate 10 is formed by GaAs that is formed by a (100) face towards a (111)B face with an angle of inclination between 0.6° and 25°.

It should be noted that the third embodiment shown in FIG. 3 is similar to the first embodiment shown in FIG. 1. The primary difference between the first embodiment and the third embodiment is that the third embodiment further includes the intermediate composite layer 15 which is provided between the substrate 10 and the sub-collector layer 20. The other elements included in the third embodiment are the same as those of the first embodiment, and the detailed descriptions for those elements are not repeated hereinafter.

Specifically, the intermediate composite layer 15 may include at least one buffer layer formed by group III-V semiconductor materials. Alternatively, the intermediate composite layer 15 may include a field effect transistor (FET).

Furthermore, the intermediate composite layer 15 may also include a pseudomorphic high-electron-mobility transistor (pHEMT). The pHEMT includes at least one buffer layer 151, a first donor layer 152, a first spacer layer 153, a channel layer 154, a second spacer layer 155, a second donor layer 156, a Schottky layer 157, an etch stop layer 158 and a cap layer 159 for an ohmic contact. Particularly, the buffer layer is formed by group III-V semiconductors. The first and second donor layers are formed by at least one of N-type GaAs, N-type AlGaAs, N-type InAlGaP, N-type InGaP and N-type InGaAsP, the first and second spacer layers are formed by at least one of GaAs, AlGaAs, InAlGaP, InGaP and InGaAsP. The channel layer is formed by at least one of GaAs, InGaAs, AlGaAs, InAlGaP, InGaP and InGaAsP. The Schottky layer is formed by at least one of GaAs, AlGaAs, InAlGaP, InGaP and InGaAsP. The etch stop layer is formed by at least one of GaAs, AlGaAs, InAlGaP, InGaAsP, InGaP and AlAs. Additionally, the cap layer is formed by N-type group III-V semiconductors.

Figure 4:
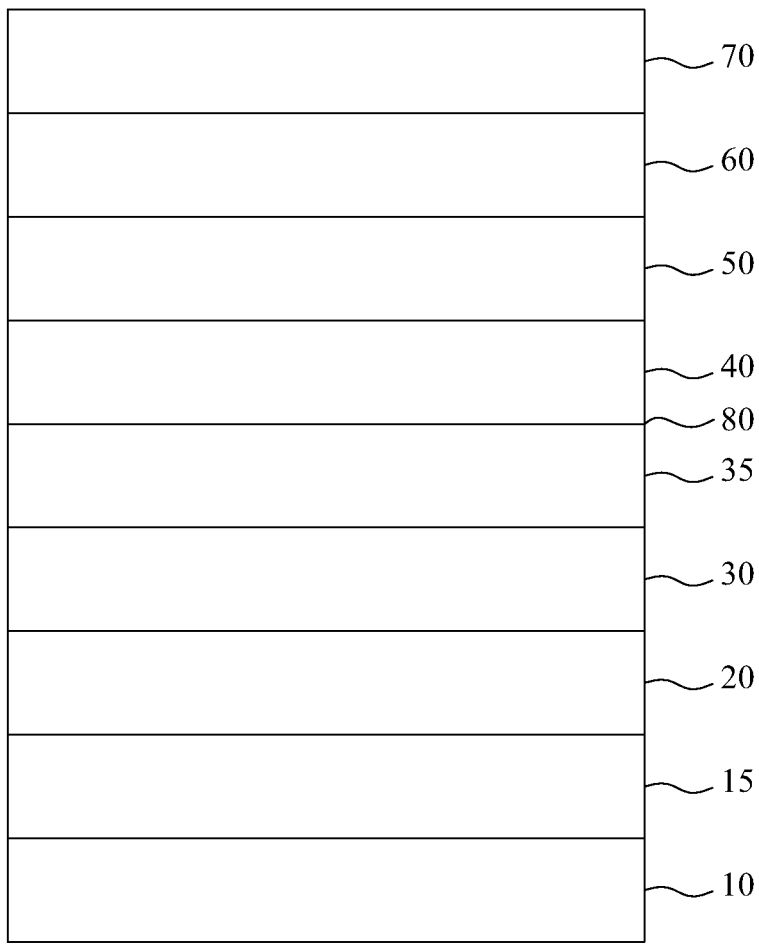
FIG. 4 is a sectional view showing the directed epitaxial HBT structure according to a fourth embodiment of the present invention.

FIG. 4 is a sectional view showing the directed epitaxial HBT structure according to the fourth embodiment of the present invention. The fourth embodiment shown in FIG. 4 includes an intermediate composite layer 15, a sub-collector layer 20, a collector layer 30, a tunnel collector layer 35, a base layer 40, an emitter layer 50, an emitter cap layer 60 and an ohmic contact layer 70, which are sequentially stacked on the substrate 10. Similar to the third embodiment shown in FIG. 3, the intermediate composite layer 15 is formed by semiconductor materials and stacked on the substrate 10. Accordingly, the substrate 10 is formed by GaAs that is formed by a (100) face towards a (111)B face with an angle of inclination between 0.6° and 25°.

It should be noted that the fourth embodiment shown in FIG. 4 is similar to the second embodiment shown in FIG. 2. The primary difference between the second embodiment and the fourth embodiment is that the fourth embodiment further includes, as shown in third embodiment and FIG. 3, the intermediate composite layer 15 provided between the substrate 10 and the sub-collector layer 20. In addition, the tunnel collector layer 35 is stacked on the collector layer 30 and formed by InGaP or InGaAsP. The emitter layer 50 is stacked on the base layer 40 and formed by N-type group III-V semiconductors having a bandgap larger than that the base layer 40. The other elements included in the fourth embodiment are the same as those of the second embodiment, and the detailed descriptions for those elements are not repeated hereinafter.

Moreover, similar to the first and second embodiments, the third and fourth embodiments may further include at least one thin layer 80 that is formed by group III-V semiconductors and provided between the emitter layer 50 and the base layer 40 or between the tunnel collector layer 35 and the base layer 40. Especially, a conduction band of the at least one thin layer is equivalent to and/or lower than a conduction band of the emitter layer 50, and the at least one thin layer has a total thickness between 1 Å and 1000 Å. More specifically, the at least one thin layer is formed by at least one of AlGaAs, InGaP, InGaAsP, GaAs, GaAsP, InGaAs, GaAsSb and InGaAsN.

Figure 5A:
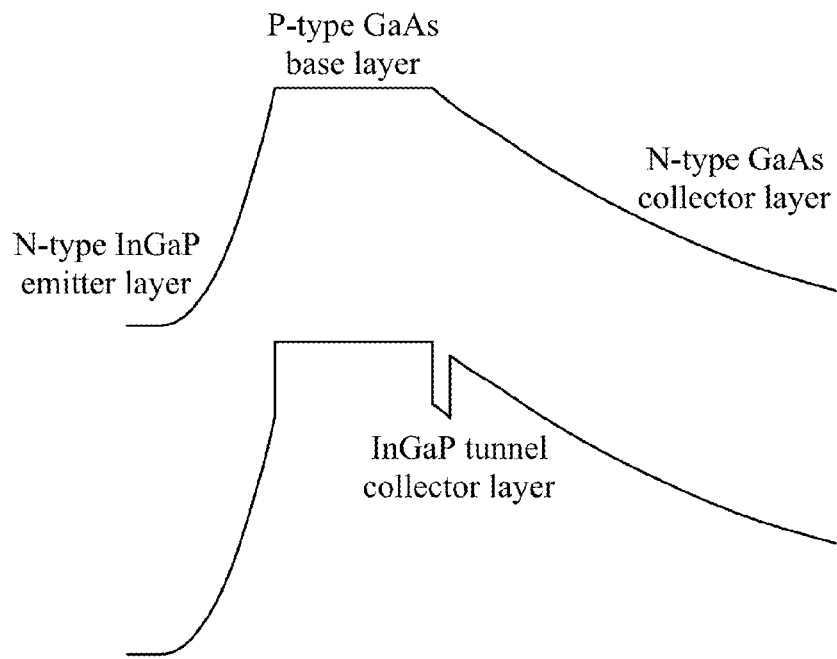
FIG. 5(a) is an example of energy band diagram showing the directed epitaxial HBT structure according to the present invention.
Figure 5B:
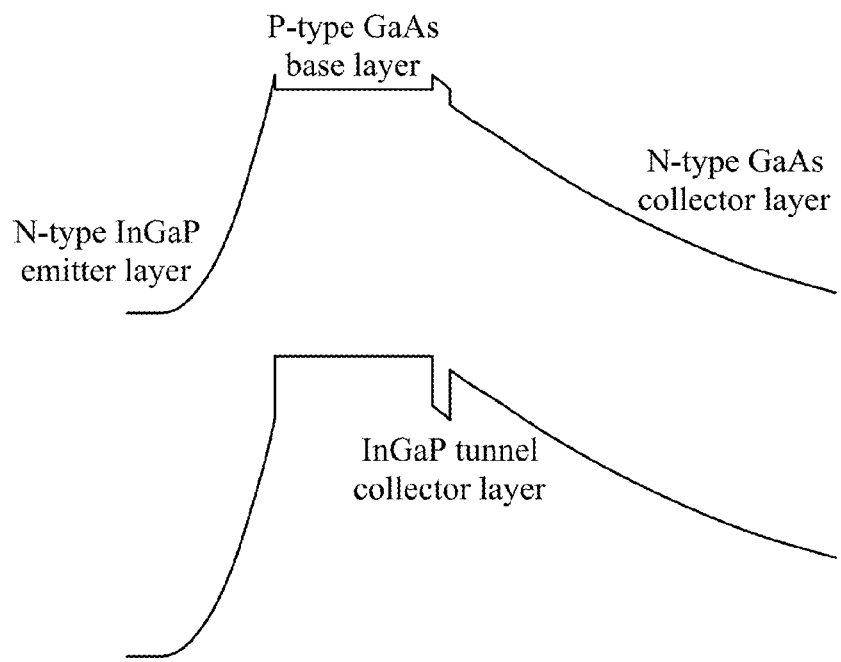
FIG. 5(b) is an example of energy band diagram showing the prior art HBT.

FIGS. 5(*a*), 5(*b*), 6(*a*) and 6(*b*) illustrate the electrical characteristics of the HBT according to the present invention in comparison with the prior arts.

FIG. 5(*a*) shows an example of energy band diagram of the directed epitaxial HBT structure according to the present invention. As shown in FIG. 5(*a*), since the InGaP is formed on the GaAs substrate 10 that is formed by a (100) face towards a (111)B face, indium and gallium may be more orderly arranged along a <111> direction (in comparison with InGaP or InGaAsP formed on the GaAs substrate that is formed by a (100) face towards a (110) face). Accordingly, the discontinuity of the conduction band of InGaP emitter layer 50, the tunnel collector layer 35 with the base layer 40 may be reduced or fully eliminated, thereby lowering the turn-on voltage and improving the collector current blocking effect of the HBT. As such, the knee voltage is decreased. Additionally, FIG. 5(*b*) shows an example of energy band diagram for the prior art HBT. Specifically, the prior art HBT including the InGaP emitter layer and the tunnel collector layer are formed on the GaAs substrate formed by a (100) face towards a (110) face. It is obvious that the larger discontinuity ($\Delta E_c$) of the conduction band exists between the base-emitter junction and the base-tunnel collector junction, thereby increasing the turn-on voltage and the collector current blocking effect. The knee voltage is thus increased, and the electrical characteristics of the prior art HBT are degraded. However, the directed epitaxial HBT of the present invention can provide better electrical characteristics.

Figure 6A:
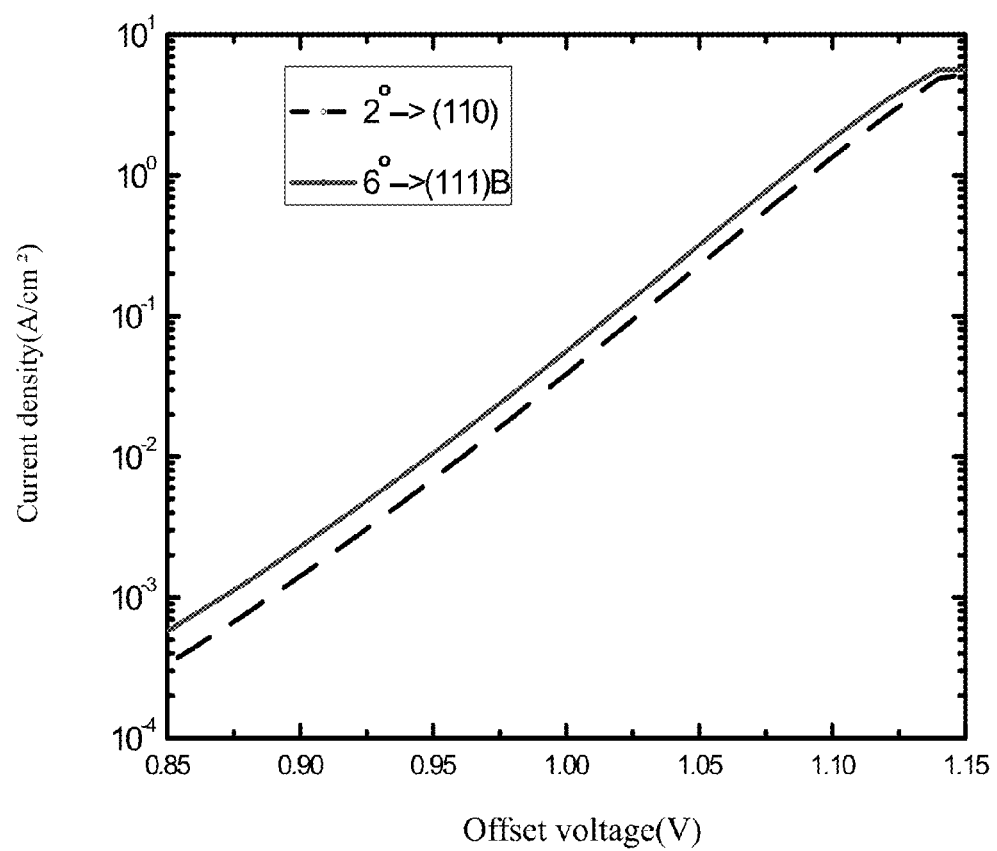
FIG. 6(a) is an electrical I-V electrical characteristics diagram showing the directed epitaxial HBT structure according to the present invention in comparison with the prior art HBT.
Figure 6B:
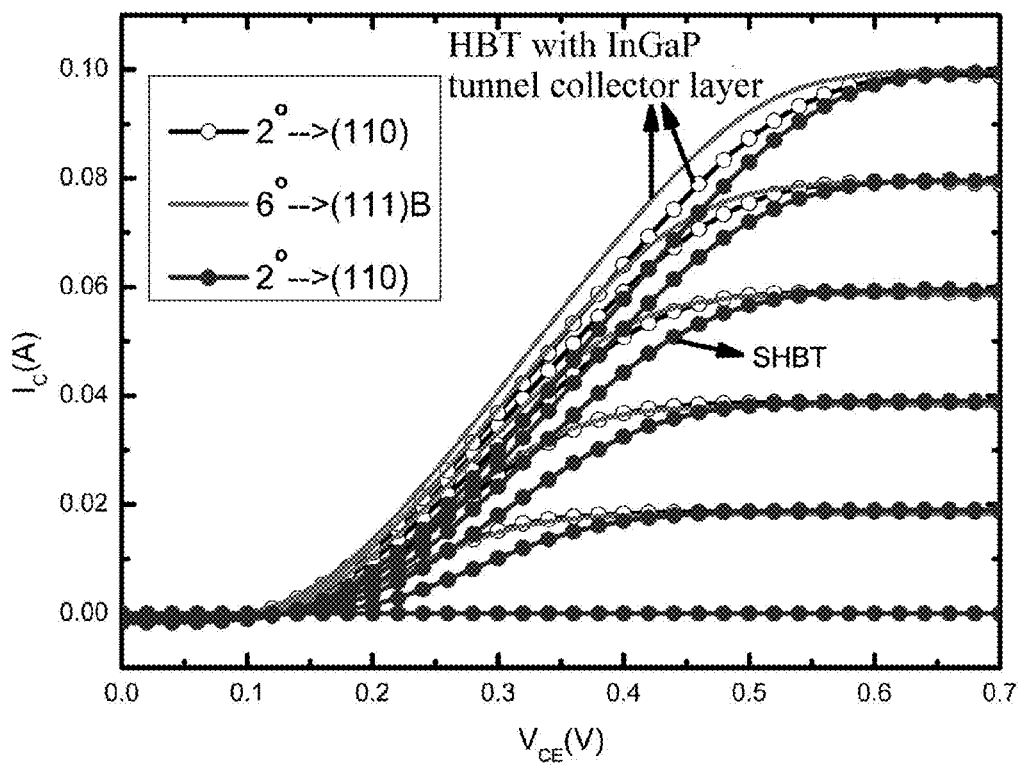
FIG. 6(b) is an electrical $I_c$-$V_{ce}$ electrical characteristics diagram showing the directed epitaxial HBT structure according to the present invention in comparison with the prior art HBT.

FIG. 6(*a*) shows an diode I-V curve of the emitter and base junction of the directed epitaxial HBT structure according to the present invention in comparison with the prior art HBT. As shown in FIG. 6(*a*), the dashed line represents the I-V curve for the prior art HBT formed by a (100) face towards a (110) face with an angle of inclination of 2°, and the solid line represents the curve for the HBT formed by a (100) face towards a (111)B face with an angle of inclination of 6° according to the present invention. It can clearly be seen that the present invention can decrease the turn-on voltage. Further, FIG. 6(*b*) shows an electrical $I_c$-$V_{ce}$ characteristics for the prior art HBT formed by a (100) face towards a (110) face with an angle of inclination of 2°, and the directed epitaxial HBT structure formed by a (100) face towards a (111)B face with an angle of inclination of 6° according to the present invention. As shown in FIG. 6(*b*), it is obvious that as compared with the prior arts, the present invention not only decreases the offset voltage but also lowers the knee voltage. The offset voltage refers to the collector-emitter voltage $V_{CE}$ when the collector current $I_c$ is zero, and the knee voltage refers to a boundary voltage between the saturation and active regions. Therefore, the directed epitaxial HBT structure provided by the present invention overcomes the problems of the prior arts, thereby improving the overall electrical performance.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A directed epitaxial heterojunction bipolar transistor (HBT) structure, comprising:
    a sub-collector layer formed by N-type group III-V semiconductors and stacked on a substrate, wherein the substrate is formed by GaAs that is formed by a (100) face towards a (111)B face with an angle of inclination between 1.1° and 14°;
    a collector layer stacked on the sub-collector layer and formed by N-type group III-V semiconductors;
    a base layer stacked on the collector layer and formed by P-type group III-V semiconductors;
    an emitter layer stacked on the base layer and formed by N-type InGaP or InGaAsP;
    an emitter cap layer stacked on the emitter layer and formed by N-type group III-V semiconductors; and
    an ohmic contact layer stacked on the emitter cap layer and formed by N-type group III-V semiconductors.

2. The directed epitaxial HBT structure as claimed in claim 1, wherein the collector layer is formed by at least one of N-type GaAs, AlGaAs, InGaAs, InGaP and InGaAsP, the base layer is formed by at least one of P-type GaAs, InGaAs, InGaAsN and GaAsSb, the emitter cap layer is formed by at least one of N-type GaAs, InGaP, InGaAsP and AlGaAs, and the ohmic contact layer is formed by at least one of N-type GaAs and InGaAs.

3. The directed epitaxial HBT structure as claimed in claim 1, further comprising at least one thin layer, wherein a conduction band of the at least one thin layer is equivalent to and/or lower than a conduction band of the emitter layer, and is provided between the emitter layer and the base layer, wherein the at least one thin layer is formed by group III-V semiconductors, and has a total thickness between 1 Å and 1000 Å.

4. The directed epitaxial HBT structure as claimed in claim 3, wherein the thin layer is formed by at least one of AlGaAs, InGaP, InGaAsP, GaAs, GaAsP, InGaAs, GaAsSb and InGaAsN.

5. A directed epitaxial heterojunction bipolar transistor (HBT) structure, comprising:
a sub-collector layer formed by N-type group III-V semiconductors and stacked on a substrate, wherein the substrate is formed by GaAs that is formed by a (100) face towards a (111)B face with an angle of inclination between 1.1° and 14°;
a collector layer stacked on the sub-collector layer and formed by N-type group III-V semiconductors;
a tunnel collector layer stacked on the collector layer and formed by InGaP or InGaAsP, wherein the tunnel collector layer and the collector layer are different from each other in the set of materials;
a base layer stacked on the tunnel collector layer and formed by P-type group III-V semiconductors;
an emitter layer stacked on the base layer and formed by N-type group III-V semiconductors having a bandgap larger than a bandgap of the base layer;
an emitter cap layer stacked on the emitter layer and formed by N-type group III-V semiconductors; and
an ohmic contact layer stacked on the emitter cap layer and formed by N-type group III-V semiconductors.

6. The directed epitaxial HBT structure as claimed in claim 5, wherein the collector layer is formed by at least one of N-type GaAs, AlGaAs, InGaAs, InGaP and InGaAsP, the base layer is formed by at least one of P-type GaAs, InGaAs, InGaAsN and GaAsSb, the emitter layer is formed by at least one of N-type InGaP, InGaAsP and AlGaAs, the tunnel collector layer has a thickness between 1nm and 30 nm, the emitter cap layer is formed by at least one of N-type GaAs, InGaP, InGaAsP and AlGaAs, and the ohmic contact layer is formed by at least one of N-type GaAs and InGaAs.

7. The directed epitaxial HBT structure as claimed in claim 5, further comprising at least one thin layer, wherein a conduction band of the at least one thin layer is equivalent to and/or lower than a conduction band of the tunnel collector layer, wherein the at least one thin layer is formed by group III-V semiconductors, provided between the tunnel collector layer and the base layer, and has a total thickness between 1 Å and 1000 Å; and/or comprising at least one additional thin layer, wherein a conduction band of the at least one additional thin layer is equivalent to and/or lower than a conduction band of the emitter layer, wherein the at least one additional thin layer is formed by group III-V semiconductors, provided between the emitter layer and the base layer, and has a total thickness between 1 Å and 1000 Å.

8. The directed epitaxial HBT structure as claimed in claim 7, wherein the at least one thin layer and the at least one additional thin layer are formed by at least one of AlGaAs, InGaP, InGaAsP, GaAs, GaAsP, InGaAs, GaAsSb and InGaAsN.

9. A directed epitaxial heterojunction bipolar transistor (HBT) structure, comprising:
an intermediate composite layer formed by semiconductors and stacked on a substrate, wherein the substrate is formed by GaAs that is formed by a (100) face towards a (111)B face with an angle of inclination between 1.1° and 14°;
a sub-collector layer formed by N-type group III-V semiconductors and stacked on the intermediate composite layer;
a collector layer stacked on the sub-collector layer and formed by N-type group III-V semiconductors;
a base layer stacked on the collector layer and formed by P-type group III-V semiconductors;
an emitter layer stacked on the base layer and formed by N-type InGaP or InGaAsP;
an emitter cap layer stacked on the emitter layer and formed by N-type group III-V semiconductors; and
an ohmic contact layer stacked on the emitter cap layer and formed by N-type group III-V semiconductors.

10. The directed epitaxial HBT structure as claimed in claim 9, wherein the intermediate composite layer comprises at least one buffer layer formed by group III-V semiconductors.

11. The directed epitaxial HBT structure as claimed in claim 9, wherein the intermediate composite layer comprises a field effect transistor.

12. The directed epitaxial HBT structure as claimed in claim 9, wherein the intermediate composite layer comprises a pseudomorphic high-electron-mobility transistor (pHEMT), including at least one buffer layer, a first donor layer, a first spacer layer, a channel layer, a second spacer layer, a second donor layer, a Schottky layer, an etch stop layer and a cap layer for an ohmic contact, the buffer layer is formed by group III-V semiconductors, the first and second donor layers are formed by at least one of N type GaAs, N type AlGaAs, N type InAlGaP, N type InGaP and N type InGaAsP, the first and second spacer layers are formed by at least one of GaAs, AlGaAs, InAlGaP, InGaP and InGaAsP, the channel layer is formed by at least one of GaAs, InGaAs, AlGaAs, InAlGaP, InGaP and InGaAsP, the Schottky layer is formed by at least one of GaAs, AlGaAs, InAlGaP, InGaP and InGaAsP, the etch stop layer is formed by at least one of GaAs, AlGaAs, InAlGaP, InGaAsP, InGaP and AlAs, and the cap layer is formed by N-type group III-V semiconductors.

13. The directed epitaxial HBT structure as claimed in claim 9, wherein the collector layer is formed by at least one of N-type GaAs, AlGaAs, InGaAs, InGaP and InGaAsP, the base layer is formed by at least one of P-type GaAs, InGaAs, InGaAsN and GaAsSb, the emitter cap layer is formed by at least one of N-type GaAs, InGaP, InGaAsP and AlGaAs, and the ohmic contact layer is formed by at least one of N-type GaAs and InGaAs.

14. The directed epitaxial HBT structure as claimed in claim 9, further comprising at least one thin layer, wherein a conduction band of the at least one thin layer is equivalent to and/or lower than a conduction band of the emitter layer, and is provided between the emitter layer and the base layer, wherein the at least one thin layer is formed by group III-V semiconductors, and has a total thickness between 1 Å and 1000 Å.

15. The directed epitaxial HBT structure as claimed in claim 14, wherein the thin layer is formed by at least one of AlGaAs, InGaP, InGaAsP, GaAs, GaAsP, InGaAs, GaAsSb and InGaAsN.

16. A directed epitaxial heterojunction bipolar transistor (HBT) structure, comprising:
an intermediate composite layer formed by semiconductors and stacked on a substrate, wherein the substrate is formed by GaAs that is formed by a (100) face towards a (111)B face with an angle of inclination between 1.1° and 14°;
a sub-collector layer formed by N-type group III-V semiconductors and stacked on the intermediate composite layer;
a collector layer stacked on the sub-collector layer and formed by N-type group III-V semiconductors;
a tunnel collector layer stacked on the collector layer and formed by InGaP or InGaAsP, wherein the tunnel collector layer and the collector layer are different from each other in the set of materials;

a base layer stacked on the tunnel collector layer and formed by P-type group III-V semiconductors;

an emitter layer stacked on the base layer and formed by N-type group III-V semiconductors having a bandgap larger than a bandgap of the base layer;

an emitter cap layer stacked on the emitter layer and formed by N-type group III-V semiconductors; and an ohmic contact layer stacked on the emitter cap layer and formed by N-type group III-V semiconductor.

17. The directed epitaxial HBT structure as claimed in claim 16, wherein the intermediate composite layer comprises at least one buffer layer formed by group III-V semiconductors.

18. The directed epitaxial HBT structure as claimed in claim 16, wherein the intermediate composite layer comprises a field effect transistor.

19. The directed epitaxial HBT structure as claimed in claim 16, wherein the intermediate composite layer comprises a pseudomorphic high-electron-mobility transistor (pHEMT), including at least one buffer layer, a first donor layer, a first spacer layer, a channel layer, a second spacer layer, a second donor layer, a Schottky layer, an etch stop layer and a cap layer for an ohmic contact, the buffer layer is formed by group III-V semiconductors, the first and second donor layers are formed by at least one of N type GaAs, N type AlGaAs, N type InAlGaP, N type InGaP and N type InGaAsP, the first and second spacer layers are formed by at least one of GaAs, AlGaAs, InAlGaP, InGaP and InGaAsP, the channel layer is formed by at least one of GaAs, InGaAs, AlGaAs, InAlGaP, InGaP and InGaAsP, the Schottky layer is formed by at least one of GaAs, AlGaAs, InAlGaP, InGaP and InGaAsP, the etch stop layer is formed by at least one of GaAs, AlGaAs, InAlGaP, InGaAsP, InGaP and AlAs, and the cap layer is formed by N-type group III-V semiconductors.

20. The directed epitaxial HBT structure as claimed in claim 16, wherein the collector layer is formed by at least one of N-type GaAs, AlGaAs, InGaAs, InGaP and InGaAsP, the base layer is formed by at least one of P-type GaAs, InGaAs, InGaAsN and GaAsSb, the emitter layer is formed by at least one of N-type InGaP, InGaAsP and AlGaAs, the tunnel collector layer has a thickness between 1nm and 30 nm, the emitter cap layer is formed by at least one of N-type GaAs, InGaP, InGaAsP and AlGaAs, and the ohmic contact layer is formed by at least one of N-type GaAs and InGaAs.

21. The directed epitaxial HBT structure as claimed in claim 16, further comprising at least one thin layer, wherein a conduction band of the at least one thin layer is equivalent to and/or lower than a conduction band of the tunnel collector layer, wherein the at least one thin layer is formed by group III-V semiconductors, provided between the tunnel collector layer and the base layer, and has a total thickness between 1 Å and 1000 Å; and/or comprising at least one additional thin layer, wherein a conduction band of the at least one additional thin layer is equivalent to and/or lower than a conduction band of the emitter layer, wherein the at least one additional thin layer is formed by group III-V semiconductors, provided between the emitter layer and the base layer, and has a total thickness between 1 Å and 1000 Å.

22. The directed epitaxial HBT structure as claimed in claim 21, wherein the at least one thin layer and the at least one additional thin layer are formed by at least one of AlGaAs, InGaP, InGaAsP, GaAs, GaAsP, InGaAs, GaAsSb and InGaAsN.

* * * * *